(12) United States Patent
Mizrahi et al.

(10) Patent No.: US 9,680,720 B1
(45) Date of Patent: *Jun. 13, 2017

(54) OPERATIONS, ADMINISTRATION, AND MAINTENANCE (OAM) ENGINE

(71) Applicant: Marvell Israel (M.I.S.L) Ltd., Yokneam (IL)

(72) Inventors: Tal Mizrahi, Haifa (IL); David Melman, Halutz (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 112 days.

This patent is subject to a terminal disclaimer.

(21) Appl. No.: 14/480,400

(22) Filed: Sep. 8, 2014

Related U.S. Application Data

(63) Continuation of application No. 13/069,119, filed on Mar. 22, 2011, now Pat. No. 8,830,841.

(60) Provisional application No. 61/316,721, filed on Mar. 23, 2010, provisional application No. 61/357,885, filed on Jun. 23, 2010.

(51) Int. Cl.
*H04L 12/26* (2006.01)

(52) U.S. Cl.
CPC ........ *H04L 43/062* (2013.01); *H04L 43/0852* (2013.01); *H04L 43/106* (2013.01)

(58) Field of Classification Search
CPC .................................................. H04L 43/062
See application file for complete search history.

(56) References Cited

U.S. PATENT DOCUMENTS

| | | | |
|---|---|---|---|
| 6,058,102 A | 5/2000 | Drysdale et al. | |
| 6,125,404 A * | 9/2000 | Vaglica | G06F 13/24 |
| | | | 712/244 |
| 6,377,583 B1 | 4/2002 | Lyles et al. | |
| 6,614,785 B1 | 9/2003 | Huai et al. | |
| 7,194,661 B1 | 3/2007 | Payson | |
| 7,720,061 B1 | 5/2010 | Krishnaswamy et al. | |
| 7,765,294 B2 | 7/2010 | Edwards et al. | |

(Continued)

OTHER PUBLICATIONS

IEEE Std 802.1ag™-2007 (Amendment to IEEE 802.10™-2005 as amended by IEEE Std 802.1ad™-2005 and IEEE Std 802.1ak™-2007), IEEE Standard for Local and Metropolitan Area Networks—Virtual Bridged Local Area Networks, Amendment 5: Connectivity Fault Management, pp. 1-260 (Dec. 17, 2007).

(Continued)

*Primary Examiner* — Brian D Nguyen
*Assistant Examiner* — Toan Nguyen

(57) ABSTRACT

Network traffic that includes an Operations, Administration, and Maintenance (OAM) unit is received. A first data flow to which the OAM data unit belongs is identified from among a plurality of data flows of network traffic. Based on identifying the first flow of communication traffic to which the OAM data unit belongs, a first entry corresponding to the first flow is retrieved from a memory that stores OAM action data including a plurality of entries indicating how OAM data units in different flows of communication traffic are to be processed. The first entry is from among the plurality of entries and indicates how OAM data units in the first flow are to be processed, including whether the network device should modify the data unit as part of an OAM action. The OAM data unit is processed in accordance with the first entry.

24 Claims, 6 Drawing Sheets

(56) References Cited

U.S. PATENT DOCUMENTS

| | | | |
|---|---|---|---|
| 7,788,381 B2 | 8/2010 | Watson et al. | |
| 7,843,831 B2 | 11/2010 | Morrill et al. | |
| 7,924,725 B2 | 4/2011 | Mohan et al. | |
| 7,948,909 B2 | 5/2011 | Bugenhagen et al. | |
| 7,978,614 B2 | 7/2011 | Wong et al. | |
| 7,983,189 B2 | 7/2011 | Bugenhagen | |
| 8,000,318 B2 | 8/2011 | Wiley et al. | |
| 8,015,294 B2 | 9/2011 | Bugenhagen et al. | |
| 8,054,744 B1 | 11/2011 | Bishara et al. | |
| 8,089,876 B2 | 1/2012 | Katsura et al. | |
| 8,229,705 B1 | 7/2012 | Mizrahi et al. | |
| 8,599,858 B1 | 12/2013 | Mizrahi | |
| 8,830,841 B1 | 9/2014 | Mizrahi et al. | |
| 2003/0012152 A1 | 1/2003 | Feldman et al. | |
| 2003/0037159 A1* | 2/2003 | Zhao | H04L 47/20 709/232 |
| 2004/0085999 A1* | 5/2004 | Burnett | H04L 1/24 370/474 |
| 2005/0099949 A1 | 5/2005 | Mohan et al. | |
| 2005/0099951 A1 | 5/2005 | Mohan et al. | |
| 2005/0099952 A1 | 5/2005 | Mohan et al. | |
| 2005/0099954 A1 | 5/2005 | Mohan et al. | |
| 2005/0099955 A1 | 5/2005 | Mohan et al. | |
| 2006/0002292 A1 | 1/2006 | Chang et al. | |
| 2006/0092847 A1 | 5/2006 | Mohan | |
| 2006/0285501 A1 | 12/2006 | Damm | |
| 2007/0263535 A1 | 11/2007 | Shabtay | |
| 2008/0049625 A1 | 2/2008 | Edwards et al. | |
| 2008/0049637 A1 | 2/2008 | Morrill et al. | |
| 2008/0049745 A1 | 2/2008 | Edwards et al. | |
| 2008/0049775 A1 | 2/2008 | Morrill et al. | |
| 2008/0219172 A1* | 9/2008 | Mohan | H04L 12/2602 370/241.1 |
| 2008/0279183 A1 | 11/2008 | Wiley et al. | |
| 2009/0028091 A1 | 1/2009 | Dimou | |
| 2009/0185566 A1 | 7/2009 | Ogasahara et al. | |
| 2009/0190589 A1* | 7/2009 | Bains | H04L 43/106 370/392 |
| 2010/0054132 A1 | 3/2010 | Mitsumori | |
| 2010/0165883 A1 | 7/2010 | Holness et al. | |
| 2010/0302949 A1* | 12/2010 | Fukagawa | H04L 43/0841 370/241.1 |
| 2011/0164502 A1 | 7/2011 | Mohan et al. | |
| 2011/0222412 A1* | 9/2011 | Kompella | H04L 45/00 370/241.1 |

OTHER PUBLICATIONS

ITU-T Y.1731 Series Y: Global Information Infrastructure, Internet Protocol Aspects and Next-Generation Networks Internet protocol aspects—Operation, administration and maintenance, *International Telecommunication Union*, pp. 1-82 (Feb. 2008).

Busi, et al., "MPLS-TP OAM Based on Y.1731 draft-bhh-mpls-tp-oam-y1731-04.txt," MPLS Working Group Internet Draft, pp. 1-17 (Mar. 8, 2010).

\* cited by examiner

OPERATIONS, ADMINISTRATION, AND MAINTENANCE (OAM) ENGINE

CROSS-REFERENCE TO RELATED APPLICATION

This application that claims the benefit of U.S. patent application Ser. No. 13/069,119, filed on Mar. 22, 2011 (now U.S. Pat. No. 8,830,841), which claims the benefit of U.S. Provisional Patent Applications Nos. 61/316,721, filed on Mar. 23, 2010, and 61/357,885, filed on Jun. 23, 2010. The entire disclosures of the applications referenced above are hereby incorporated by reference herein in their entireties.

FIELD OF THE DISCLOSURE

The present disclosure relates generally to communication networks and, more particularly, to network devices such as switches, routers, and edge devices.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

To monitor connectivity, detect link failures, and monitor various performance parameters of computer networks, network devices such as network switches, routers, edge devices and the like often implement Operation, Administration and Maintenance (OAM) functions. OAM functions sometimes include Connectivity and Fault Management (CFM) functions as defined in ITU-T Y.1731, 802.1ag, or MPLS-TP OAM (currently being developed), for example, to detect and report link failures. Typically, OAM functions involve communicating OAM packets in a computer network, and then processing the OAM packets at the network device.

SUMMARY

In an embodiment, an apparatus is for processing Operations, Administration, and Maintenance (OAM) data units in a network device that includes an ingress interface from which an OAM data unit is received. The apparatus comprises a memory to store OAM action data including a plurality of entries that indicate how OAM data units in a plurality of respective flows of communication traffic received by the network device are to be processed by the network device; and one or more integrated circuit devices configured to: identify, from among the plurality of flows of communication traffic, a first flow of communication traffic to which the OAM data unit belongs, based on identifying the first flow of communication traffic to which the OAM data unit belongs, retrieve from the OAM action data stored in the memory a first entry from among the plurality of entries, wherein the first entry corresponds to the first flow, and the first entry indicates how OAM data units in the first flow are to be processed by the network device including whether the network device should modify the data unit as part of an OAM action, and process the OAM data unit in accordance with the first entry.

In another embodiment, a method is for processing an Operations, Administration, and Maintenance (OAM) data unit in a network device. The method includes receiving, via the network device, network traffic that includes the OAM data unit; identifying, with the network device, a first data flow to which the OAM data unit belongs from among a plurality of data flows of network traffic received by the network device; based on identifying the first flow of communication traffic to which the OAM data unit belongs, retrieving, from a memory of the network device, a first entry corresponding to the first flow, wherein the memory stores OAM action data including a plurality of entries that indicate how OAM data units in a plurality of respective flows of communication traffic received by the network device are to be processed by the network device, the first entry is from among the plurality of entries, the first entry indicates how OAM data units in the first flow are to be processed by the network device including whether the network device should modify the data unit as part of an OAM action; and processing the OAM data unit in accordance with the first entry.

DETAILED DESCRIPTION

Example methods and apparatus are described herein in the context of Ethernet networks. One of ordinary skill in the art will recognize, in light of the disclosure and teachings herein, that similar methods and apparatus are suitable for use in other communication networks as well.

Figure 1:
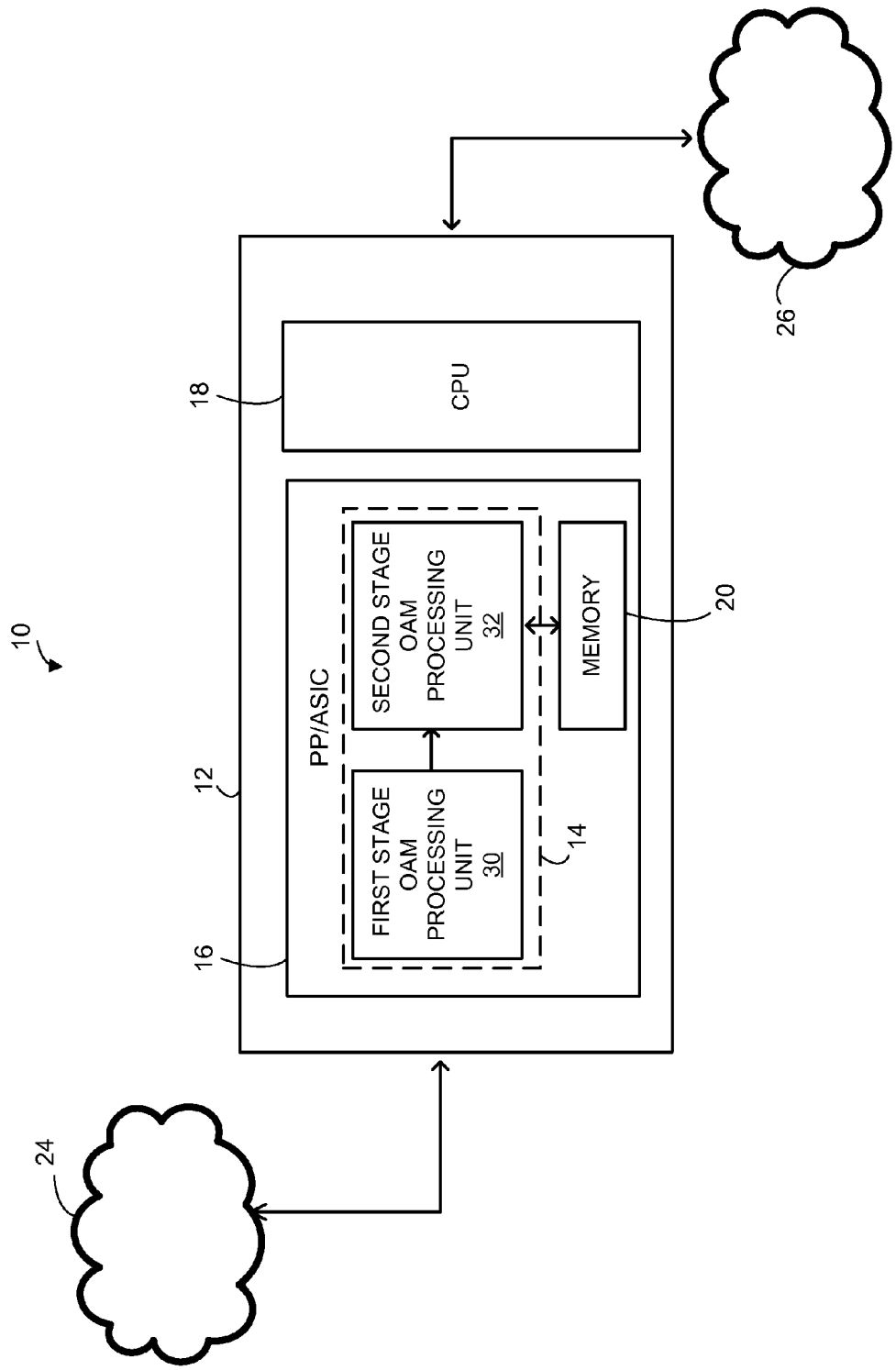
FIG. 1 is a block diagram of a communication system in which a network switch with a multi-stage OAM processing engine is utilized, according to an embodiment of the present disclosure.

FIG. 1 is a block diagram of a communication system 10 in which a network device 12 is configured to efficiently process OAM packets using a multi-stage OAM processing engine 14, in accordance with an embodiment of the present disclosure. The network device 12 is suitably a network switch, router, edge device or any other suitable network device that is configured to process OAM packets. In an embodiment, the network device 12 includes a packet processor 16, implemented using an application-specific integrated circuit (ASIC) or other hardware components, and a CPU 18 (or another suitable type of a controller) configured to process selected packets, such as, but not only, OAM packets using computer instructions stored in a non-transitory memory unit 20. In another embodiment, a network device includes hardware components configured to implement the functionality of the packet processor 16 as well as processing of selected packets. It is noted that the packet processor 16 typically includes several additional processing modules which are not seen in an effort to avoid obfuscating teaching principles of the present disclosure.

The network device 12 in the example communication system 10 is disposed between an external network 24 and an internal network 26, although generally the network device 12 can operate in any desired configuration (e.g., in a wide area network (WAN), a local area network (LAN)). In one embodiment, the packet processor 16 and the CPU 18 are disposed on the same integrated circuit (IC). In another embodiment, the packet processor 16 and the CPU 18 are disposed on different ICs, but on the same circuit board.

In an embodiment, the OAM processing engine 14 includes a first stage OAM processing unit 30 and a second stage OAM processing unit 32 and defining a first OAM processing stage and a second OAM processing stage, respectively. In an embodiment, both the first stage OAM processing unit 30 and the second stage OAM processing unit 32 are implemented in the packet processor/ASIC 16 as seen in FIG. 1. In other embodiments, the first stage OAM processing unit 30 is implemented in the packet processor/ASIC 16, while the second stage OAM processing unit 32 is implemented the CPU 18, or vice versa. In still other embodiments, both the first stage OAM processing unit 30 and the second stage OAM processing unit 32 are implemented in the CPU 18. In general, the first OAM processing stage is characterized by a relatively fast processing time that is capable of performing flow classification at least at the speed at which packets are received from the external network 24. The second OAM processing stage, however, is characterized by greater flexibility and/or relatively reduced cost due to configurable software and/or firmware components and/or random access memory architecture, according to an embodiment. The OAM processing engine 14 therefore performs certain operations, such as those that require wire-speed or near-wire-speed execution, using high performance hardware components and performs other operations, such as those that are not necessarily time-critical or that require multi-step processing or that require accessing relatively large memories, using software and/or firmware and/or flexible memory components, according to an embodiment. Moreover, in some embodiments, the OAM processing engine 14 uses programmable offsets to provide additional flexibility in processing OAM data at various levels of encapsulation. In an embodiment discussed in more detail below, the first stage OAM processing unit 30 includes a content-addressable memory (CAM) that stores information suitable for classifying various OAM flows (e.g., a unique identifier for each of N OAM data flows of communication or network traffic, or simply "OAM flows") so as to identify an OAM flow to which a certain OAM packet belongs, and the second stage OAM processing unit 32 uses the identifier determined at the first OAM processing stage to access a table (stored in a random access memory (RAM) unit, for example) that identifies and/or describes one or several processing actions to be applied to OAM packets (and, in some embodiments, non-OAM packets) that belong to the identified flow.

As used herein, the term "OAM packets" refers to data units (e.g., packets, frames) that carry information used to monitor or control the health of a network, and includes OAM and/or CFM packets as defined by the ITU-T Y.1731, 802.1ag, or MPLS-TP OAM protocols, as well as data units that conform to similar standardized or proprietary protocols. Further, the term "OAM flow" in the present disclosure refers to a series of OAM packets that share one or several properties that are selected through configuration (e.g., by a network operator) or other definition (e.g., by a certain protocol or standard). As just one example, OAM packets in a certain OAM flow share the media access channel source address (MAC SA) and the service VLAN identity (S-VID). In general, an OAM flow can be defined to have a suitable number of properties.

Figure 2A:
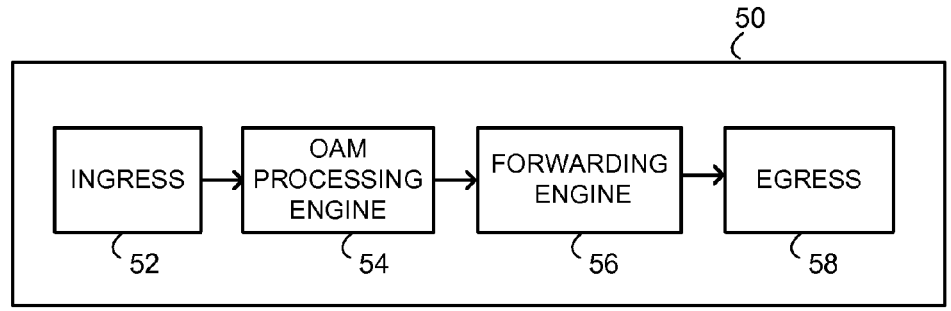
FIG. 2A is a block diagram of a network switch in which an OAM processing engine is associated with the ingress interface, according to an embodiment.

In an embodiment, the OAM processing engine 14 operates in an ingress processing module of a network device, such as a switch, router or edge device, however this need not be the case. Thus, in an embodiment, the OAM processing engine 14 optionally is disposed in an egress processing module, or is disposed in both the ingress and egress processing modules, respectively, of the network device. Referring to FIG. 2A, for example, a network device 50 (which may be used as the network device 12 in the communication system 10) includes an OAM processing engine 54 coupled to an ingress interface 52, according to an embodiment. The OAM processing engine 54 is similar or identical to the OAM processing engine 14 discussed with reference to FIG. 1. In an embodiment, the OAM processing engine 14 classifies and otherwise processes OAM packets according to properties generally associated with the ingress interface 52 (e.g., MAC SA, VLAN source port) and directs the processed OAM packets to a forwarding engine 56 which in turn is coupled to an egress interface 58. In some configurations discussed in more detail below, a forwarding engine such as the forwarding engine 56 includes several components, and the OAM processing engine determines to which of the several components of the forwarding engine an OAM packet should be directed.

Figure 2B:
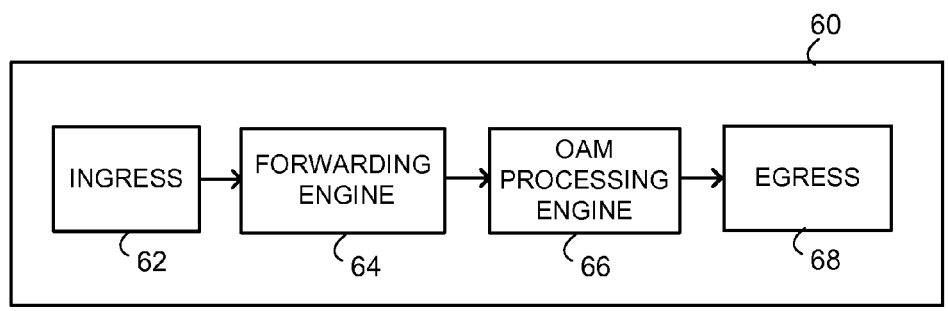
FIG. 2B is a block diagram of a network switch in which an OAM processing engine is associated with the egress interface, according to an embodiment.
Figure 2C:
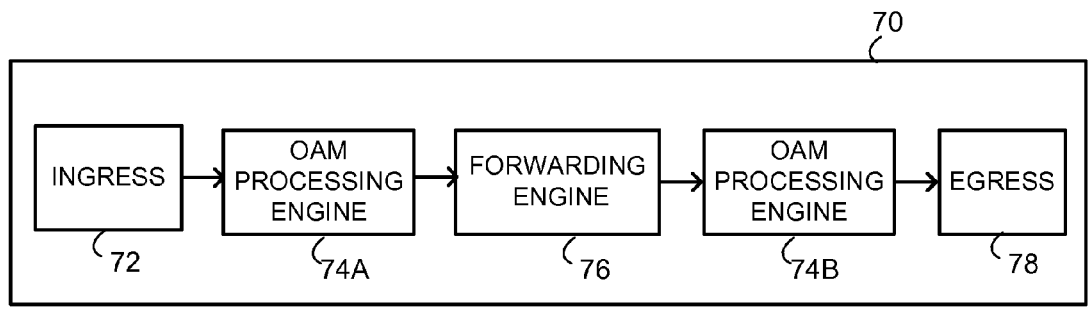
FIG. 2C is a block diagram of a network switch in which a first instance of an OAM processing engine is associated with the ingress interface, and a second instance of an OAM processing engine is associated with the egress interface, according to an embodiment.

On the other hand, a network device 60 illustrated FIG. 2B (which may be used as the network device 12 in the communication system 10) includes an ingress interface 62, a forwarding engine 64 coupled to the ingress interface 62, and an OAM processing engine 66 that classifies and otherwise processes OAM packets according to properties generally associated with an egress interface 68 (e.g., MAC DA, VLAN destination port). Further, in an embodiment illustrated in FIG. 2C, a network switch 70 includes an ingress interface 72, a first instance 74A of an OAM processing engine coupled to the ingress interface 72 to classify and process OAM packets at the ingress interface 72, a forwarding engine 76, a second instance 74B of an OAM processing engine coupled to the egress interface 78 to classify and process OAM packets directed to the egress interface 78.

Figure 5:
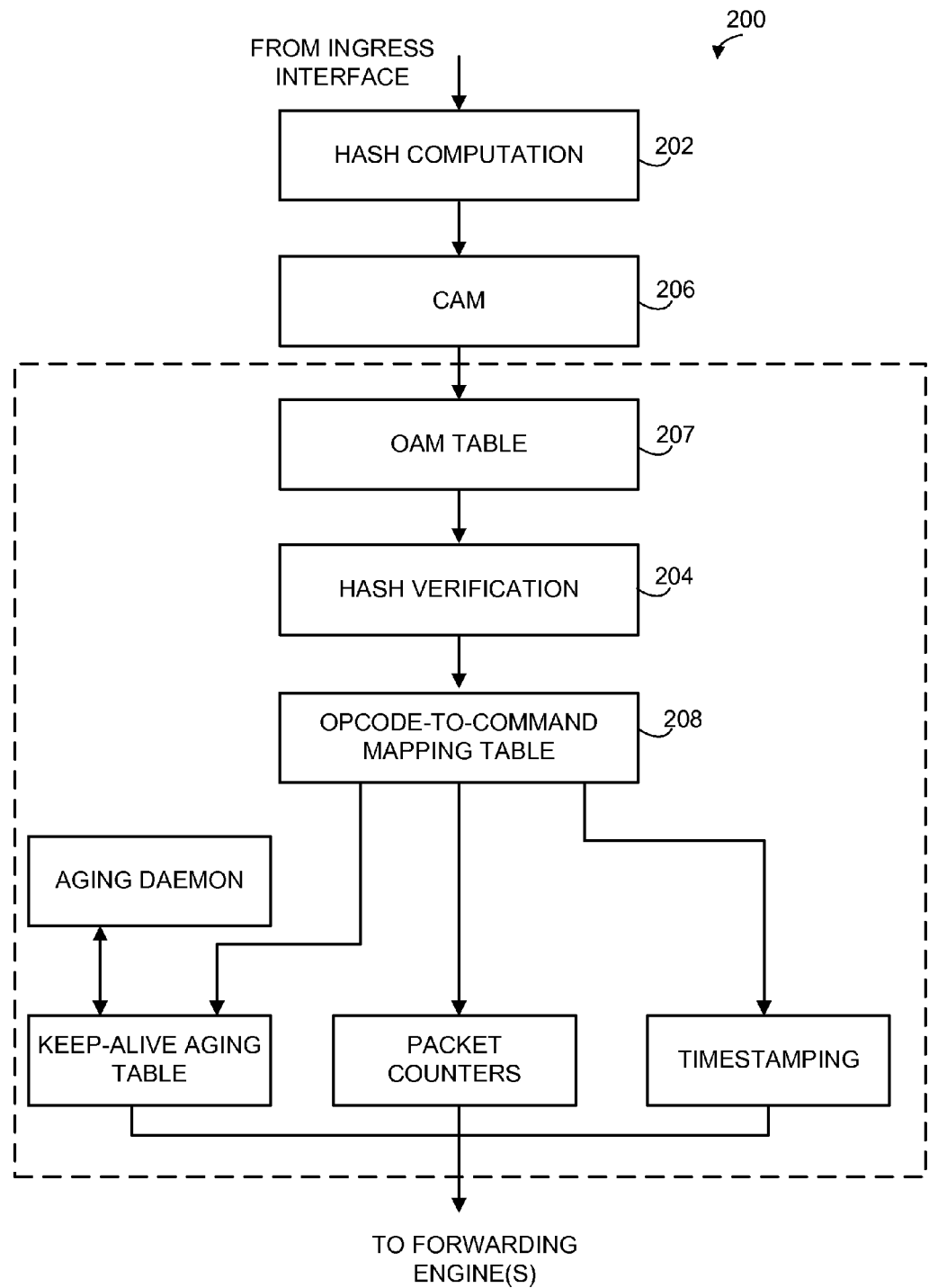
FIG. 5 is a block diagram of a multi-stage OAM processing engine that implements hash verification, according to an embodiment.

Several example embodiments of an OAM processing engine suitable to be used as the multi-stage OAM processing engine 14 are discussed with reference to FIGS. 3 and 5. First, however, several alternatives to the embodiments of FIGS. 3 and 5 are considered for clarity.

In general, it is possible to store every action for processing OAM flows in a CAM and/or TCAM unit. A typical OAM flow, however, is associated with numerous processing actions. As such, the structure of CAM and TCAM units makes such an arrangement impractical. For example, many CAM entries, possible including repeated entries, would need to be defined for each of the different flows. For a network device that handles a large number of OAM flows, OAM processing that relies solely on a CAM unit to store the different actions would thus require a very large number of CAM entries. On the other hand, while it is possible to implement complete OAM flow processing in software and/or using RAM, such a design would likely make it very difficult to fully satisfy wire-speed processing requirements.

By contrast, in the embodiment of the multi-stage OAM processing engine 14 of FIG. 1, as well as other embodiments of an OAM processing engine discussed below, a limited number of entries in a CAM (or another suitable type of search-efficient memory or mechanism for flow identification) is utilized to identify a flow, which in turn narrows the search in RAM for identifying the appropriate OAM action for a given packet which can then be accomplished significantly faster. Because an OAM processing engine consistent with these embodiments performs at least some potentially time-consuming but time-critical actions using high-speed hardware components, the necessary real-time requirements can be nevertheless satisfied.

Figure 3:
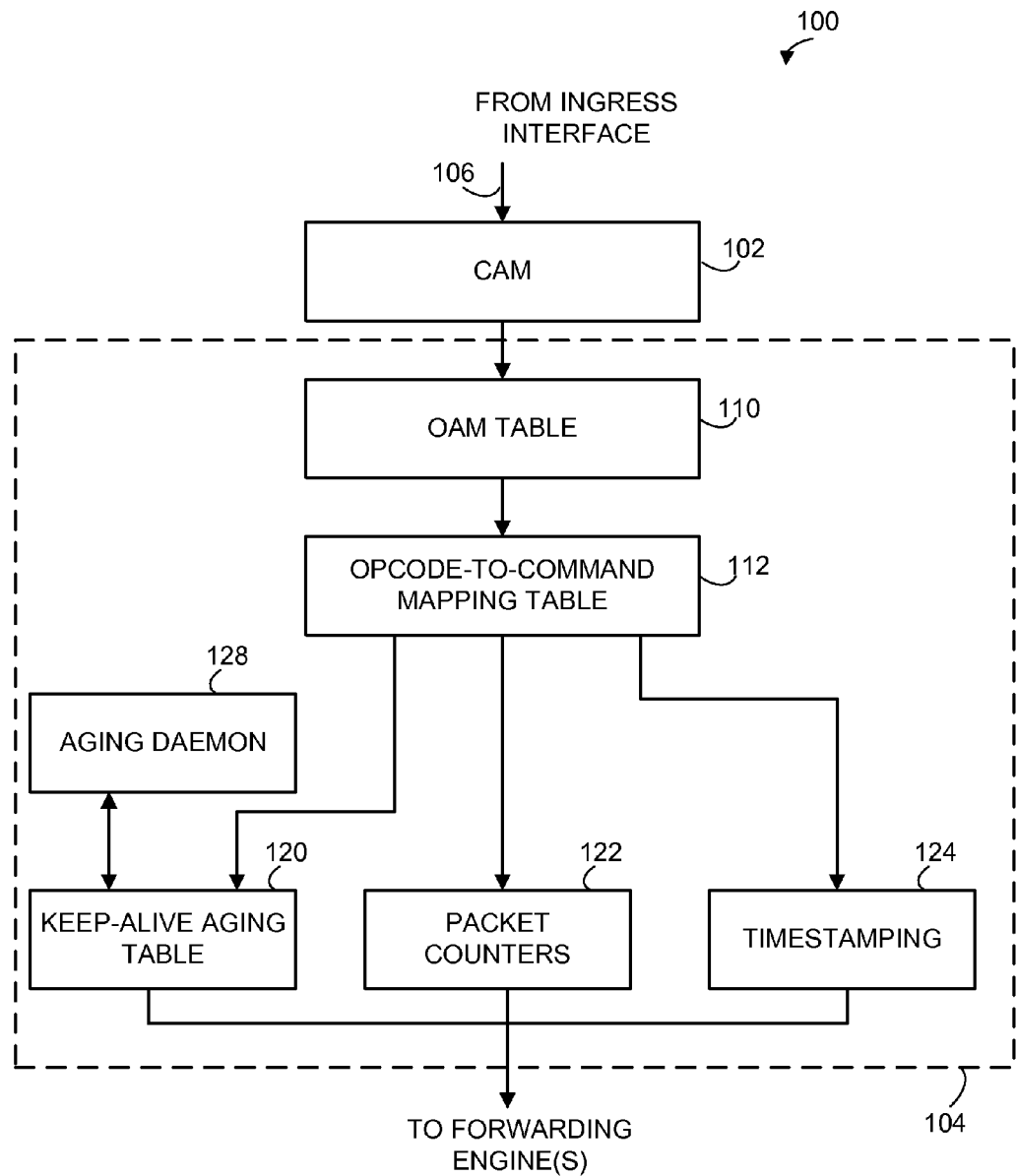
FIG. 3 is a block diagram of a multi-stage OAM processing engine, according to an embodiment.

For example, referring to FIG. 3, an OAM processing engine 100 can be used as the OAM processing engine 14 in the communication system 10, according to an embodiment. The OAM processing engine 100 includes a CAM unit 102 corresponding to a first OAM processing stage and an OAM controller 104 (e.g., a CPU configured to execute computer-readable instructions) corresponding to a second OAM processing stage, in an embodiment. The CAM unit 102 receives OAM packets from an ingress interface, for example, via an input 106, such as a port in the network device 12 (FIG. 1). Depending on the embodiment, the CAM unit 102 is implemented using binary CAM, ternary CAM (TCAM) to provide greater flexibility, or another suitable type of memory designed for efficient searching, and as used herein the term "CAM" equally refers to TCAM and other suitable memory units.

In an embodiment, an entry in the CAM unit 102 includes a data pattern that may occur in an OAM packet and a data word associated with the pattern to define a "CAM action." In some embodiments, a CAM action includes several parameters (e.g., indexes). In an example configuration, the CAM unit 102 is configured with N substantially unique patterns corresponding to N OAM flows, with each entry storing an index to an OAM table 110 (hereinafter, the "OAM table index"). In operation, the OAM processing engine 100 receives a packet and uses the CAM unit 102 to efficiently identify a stored pattern that matches parsed information from the packet to determine to which OAM flow, if any, the received packet belongs. In some embodiments, each CAM action effectively binds an OAM packet that includes the corresponding pattern to a certain maintenance entity (ME). The OAM processing engine 100 in some embodiments also receives non-OAM packets which are identified as such. The OAM processing engine 100 directs the non-OAM packets to bypass OAM processing or, in some scenarios, to packet counters.

In an embodiment, a CAM action includes an OAM enable flag to indicate whether the CAM action corresponds to an OAM packet or another type of packet (e.g., a data packet). The OAM processing engine 100 need not direct a packet to the OAM controller 104 if the packet matches the data pattern of a CAM action in which the OAM enable flag is set to "false."

Once the OAM processing engine 100 has determined that (i) a packet is an OAM packet, and (ii) the packet belongs to OAM flow F, the OAM controller 104 applies one or several processing actions defined for the OAM flow F at the second OAM processing stage (e.g., in the OAM table 110). To this end, in an embodiment, the OAM controller 104 includes memory components as well logic components (e.g., software instructions executed by the OAM controller 104) that access the memory components. In accordance with some embodiments, the OAM controller 104 includes an action identification module (e.g., a table implemented in a CAM) to identify and obtain the processing action that corresponds to the identified flow, and a processing module (that can include one or several components) to apply the identified action, i.e., process the packet according to the action. Depending on the embodiment, the OAM controller 104 performs one or more of the following: verifying the Maintenance Entity Group (MEG) level of the packet, time-stamping the packet for delay measurement, using the packet for loss measurement (LM), using the packet for keep-alive aging, etc. To apply the proper action to an OAM packet received from the ingress interface (or directed at the egress interface), the OAM controller 104 checks the operation code (hereinafter, "opcode") specified in the header of the OAM packet according to an example processing action, or processes the OAM packet based on other information according to another processing action. In an embodiment, the OAM controller 104 includes a first module that includes the table 110 and 112 as well as the associated logic, and a second module that includes the components 120-128 or similar processing units, in accordance with an embodiment. Further, in some embodiments, the OAM controller 104 includes one or more tables (such as an offset table, a table that lists opcodes used for LM counting, etc.).

Depending on the embodiment, the OAM table 110 resides in RAM, ROM, or a similar type of memory. In some embodiments, the OAM table 110 is user-configurable. The OAM table 110, in an embodiment, is indexed by the OAM table index identified at the first OAM processing stage (e.g., using the CAM unit 102), and includes entries that conform to the format summarized below in Table 1. In other embodiments, an OAM table entry omits certain fields listed in Table 1 and/or includes additional fields not listed in Table 1.

TABLE 1

| Number of Bits | Field | Description |
| --- | --- | --- |
| 1 | OAM Opcode Parsing Enable | This flag indicates whether the packet should be processed based on the opcode included in the packet, as discussed below. |
| 1 | LM Counting Enable | This flag indicates whether all or some of the packets should be counted by one or several LM counters, as discussed below. |
| 1 | MEG Level Check Enable | This flag indicates whether the MEG level of the packet should be compared to the level specified in the MEG level field, as discussed below. |
| 3 | MEG Level | This field specifies the threshold MEG level of the flow and used when the MEG Level Check Enable flag is set. |
| 1 | Dual-Ended LM Enable | This flag indicates whether packets with a certain opcode should be considered LM packets and the corresponding LM counter should be captured, as discussed below. |
| 1 | LM Counter Capture Enable | This flag indicates whether the LM counter of the packet should be captured and inserted into the packet, as discussed below. |

TABLE 1-continued

| Number of Bits | Field | Description |
|---|---|---|
| 1 | Timestamp Enable | This flag indicates whether a timestamp should be inserted into the packet, as discussed below. |
| 4 | Offset Index | This field stores an index to an offset table that specifies offsets within the packet at which information (e.g., an LM counter, a timestamp) should be inserted, as discussed below. |
| 1 | Keep-alive Aging Enable | This flag indicates whether packets with certain opcodes should be used for keep-alive aging analysis, as discussed below. |
| 12 | Age Table Index | This field stores an index to an aging table, as discussed below. |

In an embodiment, an OAM table entry includes the OAM Opcode Parsing Enable flag, as listed in Table 1. Accordingly, when the OAM Opcode Parsing Enable flag is set to "true," the processing action associated with the OAM table entry requires checking the opcode of the packet and selecting an action (a "packet command") according to the opcode. In some scenarios, an operator will set the OAM Opcode Parsing Enable flag to "true" to configure a network switch so as to process OAM flows consistent with the ITU-T Y.1731 or 802.1ag standards based on opcodes. In other scenarios, however, the operator sets the OAM Opcode Parsing Enable flag to "false." For example, the protocol to which a certain flow conforms may not define separate opcodes for such procedures as keep-alive aging, LM counting, etc., and therefore the opcode of the packet does not provide the OAM controller 104 with sufficient information relevant to these procedures. As another example, a generic time-stamping mechanism usually does not require that OAM packets be differentiated based on the opcode.

In some configurations, the OAM Opcode Parsing Enable flag is set to "true" for CFM flows, and one entry in CAM unit 102 as well as one entry in the OAM table 110 are allocated for a typical CFM flow. Similarly, one entry in the CAM unit 102 as well as one entry in the OAM table 110 are allocated for a typical non-CFM OAM flow, except that the OAM Opcode Parsing Enable flag is set to "false," and the OAM table entry additionally specifies a function (e.g., timestamping, LM measurement capturing) to be performed on the packet.

In an embodiment, the OAM controller 104 includes a table 112 that maps packet opcodes to corresponding processing units, such as a keep-alive aging table 120, a packet counter block 122, a timestamping unit 124, etc. Example embodiments of the keep-alive aging table 120, as well as an aging daemon 128 that services the keep-alive aging table 120, are described in the U.S. patent application Ser. No. 12/785,936 filed on May 24, 2010, the entire disclosure of which is hereby incorporated by reference herein. Further, example embodiments of the processing units 122 and 124 are described in the U.S. patent application Ser. No. 12/536,417 filed on Aug. 5, 2009, the entire disclosure of which is also hereby incorporated by reference herein.

With continued reference to FIG. 3 and Table 1, an OAM table entry, in an embodiment, includes the LM Counting Enable flag to selectively enable or disable LM counting. In an embodiment, a set of one or more LM counters is maintained for each flow. When the LM Counting Enable flag is set to "true," the OAM controller 104 additionally checks the OAM Opcode Parsing Enable flag discussed above, according to an embodiment. If the OAM Opcode Parsing Enable flag is set to "false," the OAM controller 104 increments the corresponding LM counter for each packet regardless of its opcode. In some embodiments, an LM counter is also updated in response to receiving a non-OAM packet, such as a data packet. On the other hand, if the OAM Opcode Parsing Enable flag is set to "true," the OAM controller 104 updates the corresponding LM counter only if the opcode of the packet matches one or several opcodes used for LM counting. For example, LM counting for a certain flow can be configured so that Continuity Check Message (CCM) packets are counted but Link Trace Message (LTM) packets are not counted. In some embodiments, the types of packets to be counted for LM purposes are defined by a standard (e.g., Y.1731).

In an embodiment, an LM counter is 32 bits long. Further, in an embodiment, network switches exchange LM counter values using LM Message (LMM) packets and LM Reply (LMR) packets.

In some embodiments, the OAM controller 104 checks the MEG level (e.g., the level within the hierarchy of maintenance association) of an OAM packet associated with a flow F if the MEG Level Check Enable flag in the corresponding entry of the OAM table 110 is set to "true." It is noted that a MEG generally corresponds to a physical or logical (e.g., administrative) portion of a computer network, and a given MEG can include two or more interconnected MEG End Points (MEPs) such as network switches, routers, etc. In an example configuration, the processing action further specifies a certain MEG level L in the MEG Level field and requires that a packet be dropped if the MEG level of the packet is lower or higher than that the MEG level L, and forwarded on if the MEG level of the packet is equal to the MEG level L. A certain predefined value (such as zero, for example) indicates that no packets are to be dropped due to the MEG level value of the packet, according on embodiment. In these embodiments, if the MEG Level Check Enable flag is set to "false," the OAM controller 104 does not check the MEG level of a packet.

An OAM table entry, in some embodiments, also includes the Dual-Ended LM Enable flag. When set to "true," the Dual-Ended LM Enable flag indicates to the OAM controller 104 that a packet with an opcode that matches a certain defined value (e.g., a DUAL-ENDED_LM_OPCODE configuration parameter used by the OAM processing engine 100) should be treated as an LM packet. In an embodiment, to process packets in this manner, the LM Counter Capture Enable and the OAM Opcode Parsing Enable flags also must be set to "true."

Still referring to FIG. 3 and Table 1, an OAM table entry includes the LM Counter Capture Enable flag to indicate whether the LM counter of the packet should be captured and inserted into the packet, in accordance with an embodiment. For example, if the LM Counter Capture Enable flag is set to "true," the OAM controller 104 should capture the current value of the LM counter and insert the captured value into the packet. In an embodiment, the OAM controller 104 inserts the value of the LM counter only if the packet is an LMM or LMR packet. For example, the OAM controller 104 checks the OAM Opcode Parsing Enable flag and compares the opcode of the packet to the corresponding list of opcodes.

The OAM controller 104 accesses an LM counter table (not shown) to retrieve the value of the appropriate LM counter, according to an embodiment. The LM counter table can be indexed using the index to the OAM table 110.

Referring to back to FIG. 2A, the OAM processing engine 54 inserts the current value of a receive (Rx) LM counter if the LM Counter Capture Enable flag is set to "true" because the OAM processing engine 54 is coupled to the ingress interface 52. On the other hand, referring to FIG. 2B, the OAM processing engine 66 inserts the current value of a transmit (Tx) LM counter if the LM Counter Capture Enable flag is set to "true" because the OAM processing engine 54 is coupled to the egress interface 68.

In an embodiment, both the LM Counter Capture Enable flag and the Dual-Ended LM Enable flag are set to "true" in a certain OAM table entry. If the opcode of the packet matches a certain opcode (the "Dual-Ended LM Enable opcode"), LM counter capture is enabled for the specified packet type.

In some embodiments, an OAM table entry includes the Timestamp Enable flag to indicate whether the current time, or another type of a timestamp, should be inserted into the packet. The timestamp can include a 48-bit seconds field and a 32-bit nanoseconds field, for example. In an embodiment, the length of the timestamp is eight bytes including the four least significant bytes of the seconds field and the four bytes of the nanoseconds field.

Further, in one such embodiment, the Offset Index field specifies the offset relative to the beginning of the packet at which the timestamp should be inserted into the packet. According to an embodiment, timestamping is required for Delay Measurement (DM) packets, and the OAM controller 104 accordingly timestamps DM packets regarding of the value of the Timestamp Enable flag.

Still further, when the Timestamp Enable flag is set to 'true," the OAM controller 104 further checks the OAM Opcode Parsing Enable flag and, if necessary, the list of opcodes associated with this flag to determine whether all packets in the flow or only the packets with a certain opcode should be timestamped.

In an embodiment, an OAM table entry includes the Keep-alive Aging Enable flag to indicate whether keep-alive aging is enabled. Suitable techniques for managing keep-alive information in a network switch, as well components that can implement such techniques, are described in detail in the '936 application identified above. Briefly, the OAM processing engine 100 uses keep-alive aging techniques to verify the validity of a connection to another network node (e.g., another network switch) using periodic keep-alive messages sent at a certain, typically constant, periodicity. A link failure is detected in response to not receiving any keep-alive packets from the network node during n intervals. To this end, the OAM processing engine 100 maintains the state of each flow and generates a notification (to a certain application, service, etc.) when the last received keep-alive packet in the flow has aged beyond n intervals.

In an example scenario, the OAM controller 104 checks the opcode of the packet, determines whether the opcode matches an opcode in the list of keep-alive opcodes corresponding to the OAM table entry, and resets the age of the OAM flow to zero if the opcodes match. In an embodiment, the OAM controller accesses the appropriate entry in the keep-alive aging table 120 using the Age Table Index field. In an embodiment, the OAM controller 104 applies keep-alive aging techniques to CCM packets if the OAM flow is consistent with one of CFM standards.

With continued reference to FIG. 3, the opcode-to-command mapping table 112 maps opcodes to packet commands, according to an embodiment. Depending on the specific scenario, an opcode is mapped to the command FORWARD, MIRROR, TRAP, DROP, LOOP, etc. As a more specific example, the OAM controller 104 in a certain configuration traps LTM packets and loops back the packet of type Loopback (LBM). As another example, the OAM controller 104, in an embodiment, is configured to drop keep-alive packets. When the OAM controller 104 includes the opcode-to-command mapping table 112 or a similar module, it is generally unnecessary to define opcode-specific actions in the CAM unit 102.

In another embodiment, an OAM processing engine 100 stores two CAM actions that potentially apply to each packet: the first action is used for classification, i.e., to determine the flow to which the packet belongs, and the second action is used to bind the flow to an LM counter. Unlike the embodiment discussed above, in which N actions are stored in the CAM memory unit 102 for N flows, the OAM processing engine 100 in this embodiment requires 2N CAM actions. However, an OAM processing engine that uses 2N CAM actions in the first OAM processing stage identifies appropriate LM counters earlier and, in at least some implementations, faster than an OAM processing engine that uses the CAM memory unit 102 only for flow classification.

In yet another embodiment, the OAM processing engine 100 is configured with N+1 CAM actions in the first OAM processing stage for N flows. In this embodiment, one CAM action is used to determine whether the packet is an OAM packet, and N additional actions are used to determine to which flow the OAM packet belongs. If the OAM processing engine determines that the packet is a non-OAM packet, the packet bypasses the tables 110 and 122 and proceeds directly to the packet counter block 122. An OAM processing engine consistent with this embodiment can be used in configurations where both OAM and non-OAM traffic arrives at the OAM processing engine, for example.

As previously indicated, the functionality of the modules 120, 122, 124, and 128 is described in detail in the above-incorporated '936 and '417 patent applications. Briefly, in a typical embodiment, the keep-alive aging table 120 and the aging daemon 128 handle keep-alive packets such as CCM packets, for example. The packet counter 122 maintains LM counters (stored as variables in a RAM unit, for example) for various flows and, in some scenarios, inserts LM counter values into packets, and the timestamping unit 124 generates timestamps and inserts the generated timestamps into delay measurement or other packets, according to an embodiment.

Figure 4:
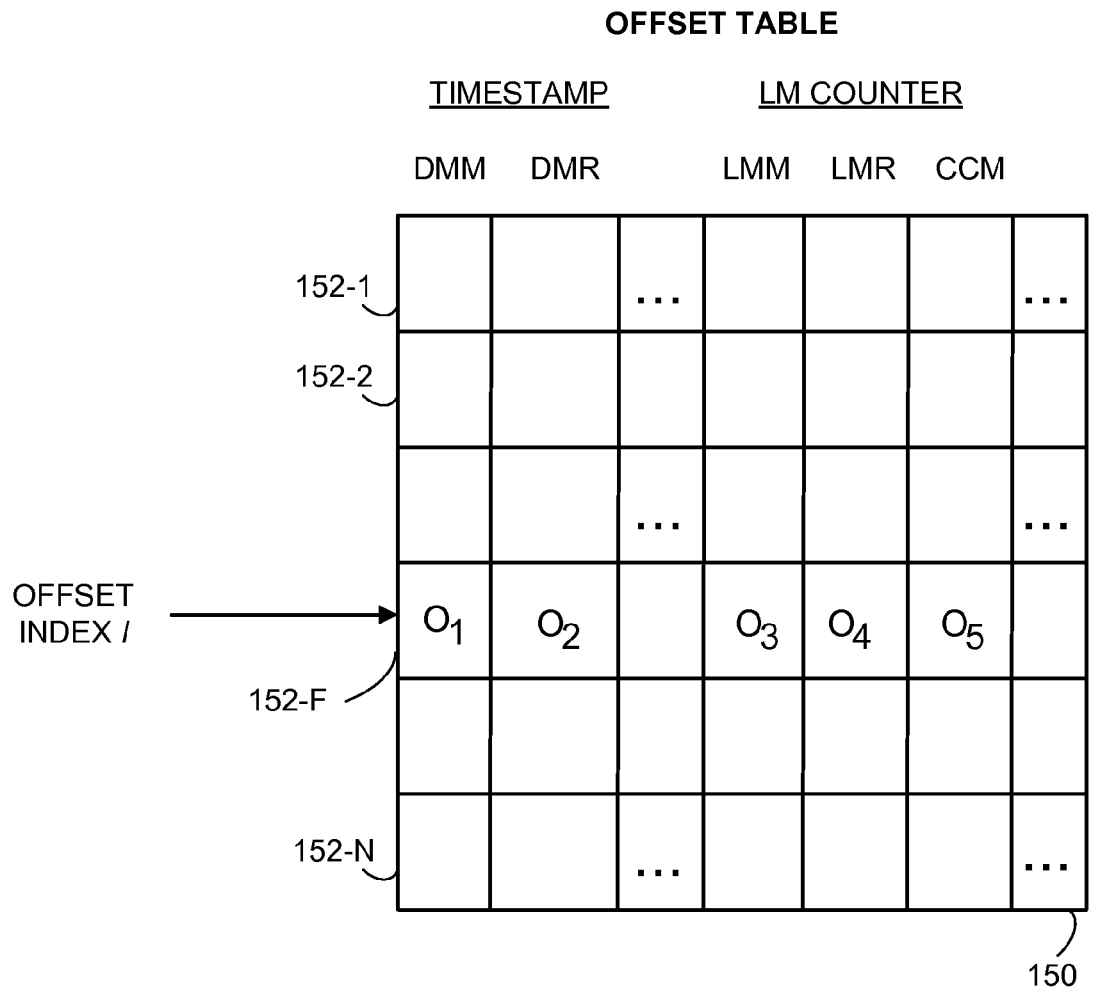
FIG. 4 is a block diagram of a memory unit that stores offsets to fields of OAM packets, according to an embodiment.

The OAM controller 104 in some embodiments accesses one or several portions of a packet for reading and/or writing using the Offset Index field in the corresponding OAM table entry. FIG. 4 illustrates an example offset table 150 which the OAM controller 104 uses to flexibly indicate positions of fields or information elements in packets of various types for various flows, according to an embodiment. The offset table 150 is allocated in RAM, ROM, or another type of memory, and includes N entries 152-1, 152-2, . . . 152-N. In an embodiment, each of the entries 152-1, 152-2, . . . 152-N specifies offsets relative to the beginning of Layer 2 (L2) portion of the packet for several message types. For example, in the entry 152-F corresponding to flow F and indexed by offset index I, the offset table 150 lists offset values $O_1$ and $O_2$ for inserting timestamp values into Delay Measurement Message (DMM) and Delay Measurement Reply (DMR) packets, respectively. Further, in an embodiment, the entry 152-F lists offset values $O_3$-$O_5$ for inserting LM counter values into LMM, LMR, and CCM packets, respectively. Depending on the embodiment, entries of the offset table 150 list offsets for inserting information, as is the case with the offsets $O_1$-$O_5$, offsets for retrieving information (e.g., the offset of an LM counter received from another network device), or both. In this manner, the OAM controller 104 can efficiently processes packets for various types and levels of encapsulation. Further, in at least some of the embodiments, the offset table 150 is configurable so that non-standard flows can be configured for processing. In these cases, some of the columns defined for known message types, such as LMM or LMR, can be used for packets specific to the network switch that implements the offset table 150.

From the foregoing, it is noted that it is unnecessary to define opcode-specific actions in the CAM 102, and much of OAM processing can be performed using conventional memory resources (e.g., RAM) and software components in the OAM controller 104. Also, it will be noted that complex processing actions that can be defined, if desired, by setting multiple flags and/or parameter fields (e.g., indexes) in OAM table entries, thus making the OAM processing engine 100 flexible and robust. Moreover, indexing techniques discussed with reference to FIGS. 3 and 4 allow the OAM processing engine 100 to efficiently handle various types and levels encapsulation.

Referring to FIG. 5, an OAM processing engine 200 is generally similar to the OAM processing engine 100 discussed with reference to FIG. 3. However, the OAM processing engine 200 also implements hash verification of OAM packets to ensure correctness of inbound or outbound OAM packets. The OAM processing engine 200 includes a hash computation block 202 that computes a hash value based on a set of "interesting" fields (e.g., obtained by parsing information from the packets) and a hash verification block 204 to determine whether the computed hash value matches the hash value expected for the flow to which the packet belongs, according to an embodiment. Thus, in at least some of the embodiments of the OAM processing engine 200, a hash value is computed for a packet, the flow to which the packet belongs is identified, and an expected hash value corresponding to the flow is retrieved.

Depending on the embodiment, the hash computation block 202 is disposed upstream of a CAM unit 206 (that implements functions similar to the functions of the CAM unit 102), as illustrated in FIG. 5, downstream of the CAM unit 206, or parallel to the CAM unit 206. Further, the hash computation block 202 is suitably implemented in hardware, firmware, software, or a combination thereof, depending on the embodiment. Similarly, the hash verification unit 204 in various embodiments is disposed downstream or upstream of an opcode-to-command mapping table 208, and includes hardware components, firmware components, software components, or a combination thereof. In an embodiment, the hash verification unit 204 includes a table disposed in RAM, for example, to store expected hash values for various flow and/or packet types. Further, in an embodiment, the OAM processing engine 200 includes an OAM table 207 that stores entries that conform to the format summarized above in Table 1, for example. In an embodiment, an entry in the OAM table 207 includes an index to the hash value table associated with the hash verification unit 204.

In an embodiment, the selection of fields based on which the hash computation unit 202 computes a hash value is configurable. In general, hash computation can be based on flow types (e.g., a flow defined by a certain MAC SA and a certain S-VID) and or packet types (e.g., CCM packets). In an example scenario, a user configures the OAM processing engine 200 to compute a hash value based on the Ethernet type field, VLAN ID field, and the physical port on which the packet is received. In another example scenario, the hash value is based on the MAC SA field.

It is noted that the Y.1731 protocol specifies several defect conditions corresponding to such unexpected values in a CCM packet as the wrong MEG identity, the wrong MEP identity, and the wrong value of the Period field. In an embodiment, the OAM processing engine 200 is configured to efficiently detect these conditions by comparing a computed hash value to an expected hash value using flow classification results, as discussed above.

Figure 6:
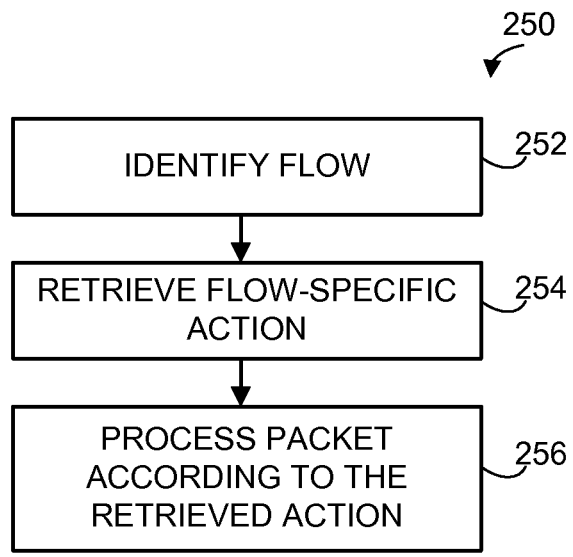
FIG. 6 is a flow diagram of an example method for processing OAM packets in several stages, in accordance with an embodiment of the present disclosure.

FIG. 6 is a flow diagram of an example method 250 for processing an OAM packet in an embodiment of the present disclosure. The example method 250 can be partially or fully implemented in the OAM processing engine 100 or 200, for example. At block 252, the flow to which a packet belongs is identified. Referring back to FIG. 3, for example, the CAM unit 102 implements block 252 according to an embodiment. In an embodiment, at block 254, an action that applies to the flow identified at block 252 is retrieved, and the packet is processed according to the retrieved action at block 256. Blocks 254 and 256 can be implemented using some or all of the components of the OAM controller 104, for example.

Figure 7:
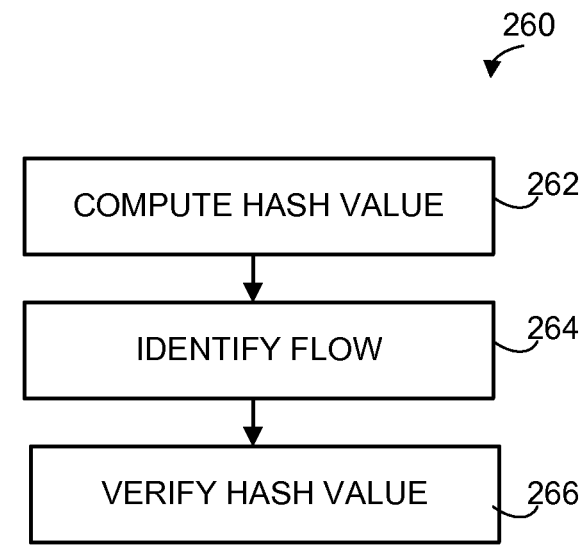
FIG. 7 is a flow diagram of an example method for verifying correctness of OAM packets.

Referring to FIG. 7, an example method 260 for verifying correctness of an OAM packet includes computing a hash value based on one or more fields of the packet at block 262. Next, at block 264, which is generally similar to block 252 discussed above, the flow to which the packet belongs is identified, according to an embodiment. In another embodiment, the type of the packet is also determined upon identifying the flow at block 264. At block 266, the hash value is verified in view of the identified flow and/or packet type, depending on the embodiment. For example, an expected hash value is retrieved from memory using the flow type, the packet type, or a combination thereof as an index and compared to the value computed at block 262. In some embodiments, a notification (e.g., an interrupt, a log file entry, a message to an application) is generated if the two hash values do not match. Referring back to FIG. 5, the blocks 262 and 266 can be implemented in the modules 202 and 204, respectively.

At least some of the various blocks, operations, and techniques described above may be implemented utilizing hardware, a processor executing firmware instructions, a processor executing software instructions, or any combination thereof. When implemented utilizing a processor executing software or firmware instructions, the software or firmware instructions may be stored on non-transitory computer readable medium such as on a magnetic disk, an optical disk, or other storage medium, in a RAM or ROM or flash memory, processor, hard disk drive, optical disk drive, tape drive, etc. Likewise, the software or firmware instructions may be delivered to a user or a system via any known or desired delivery method including, for example, on a computer readable disk or other transportable computer storage mechanism or via communication media. Communication media typically embodies computer readable instructions, data structures, program modules or other data in a modulated data signal such as a carrier wave or other transport mechanism. The software or firmware instructions may include machine readable instructions that, when executed by the processor, cause the processor to perform various acts.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

What is claimed is:

1. An apparatus for processing Operations, Administration, and Maintenance (OAM) data units in a network device that includes an ingress interface from which an OAM data unit is received, the apparatus comprising:
   a memory to store OAM action data including a plurality of entries that indicate how OAM data units in a plurality of respective flows of communication traffic received by the network device are to be processed by the network device, wherein multiple entries among the plurality of entries include respective indices to at least one table stored in the memory; and
   one or more integrated circuit devices configured to:
      identify, from among the plurality of flows of communication traffic, a flow of communication traffic to which the OAM data unit belongs,
      based on identifying the flow of communication traffic to which the OAM data unit belongs, retrieve from the OAM action data stored in the memory a first entry from among the plurality of entries, wherein the first entry corresponds to the flow,
         the first entry indicates how OAM data units in the flow are to be processed by the network device including whether the network device should modify the data unit as part of an OAM action, and
         the first entry includes an index to a first table among the at least one table, and
      when the first entry indicates that the network device should modify the data unit as part of the OAM action, obtain a second entry from the first table using the index included in the first entry, the second entry from the first table indicating how OAM data units in the flow are to be modified, and
      process the OAM data unit in accordance with the first entry, including: when the first entry indicates that the network device should modify the data unit as part of the OAM action, modify the OAM data unit in accordance with the second entry from the first table.

2. The apparatus of claim 1, wherein:
   the first entry indicates whether time stamping is enabled for the flow;
   the one or more integrated circuit devices are configured to, if the first entry indicates that time stamping is enabled for the flow,
      determine whether a time stamp is to be added to the data unit,
      determine a location in the data unit at which to add the time stamp using the second entry in the first table if it is determined that the time stamp is to be added to the data unit, and
      add the time stamp to the data unit at the determined location if it is determined that the time stamp is to be added to the data unit; and
   the one or more integrated circuit devices are configured to, if the first entry indicates that time stamping is not enabled for the flow,
      not add the time stamp to the data unit.

3. The apparatus of claim 1, wherein:
   the first entry indicates whether an opcode included in the packet should be examined to determine whether the time stamp is to be added to the data unit;
   the one or more integrated circuit devices are configured to, if the first entry indicates that the opcode included in the packet should be examined to determine whether the time stamp is to be added to the data unit,
      examine the opcode to determine whether the time stamp is to be added to the data unit, and
      add the time stamp to the data unit if the opcode indicates that the time stamp is to be added to the data unit; and
   the one or more integrated circuit devices are configured to, if the first entry does not indicate that the opcode included in the packet is to be examined to determine whether the time stamp is to be added to the data unit, add the time stamp to the data unit.

4. The apparatus of claim 1, wherein:
   the first table is an offset table;
   multiple entries among a plurality of entries in the offset table indicate respective locations within data units at which timestamps are to be inserted; and
   the one or more integrated circuit devices are configured to, when the first entry indicates that time stamping is enabled for the flow and when it is determined that the time stamp is to be added to the data unit,
      determine a location for the time stamp using the second entry retrieved from the offset table, and
      add the time stamp to the data unit at the determined location.

5. The apparatus of claim 1, wherein:
   the first entry indicates whether a value of a loss measurement (LM) counter should be added to data units in the flow;
   the one or more integrated circuit devices are configured to:
      add the value of the LM counter to the data unit if the first entry indicates that the value of the LM counter should be added to data units in the flow, and
      not add the value of the LM counter to the data unit if the first entry indicates that the value of the LM counter should not be added to data units in the flow.

6. The apparatus of claim 1, wherein:
   the one or more integrated circuit devices include one of a content-addressable memory (CAM) unit or a ternary CAM (TCAM) unit; and
   the one or more integrated circuit devices are configured to utilize the one of the CAM unit or the TCAM unit to identify the flow of communication traffic to which the OAM data unit belongs from among the plurality of flows of communication traffic.

7. The apparatus of claim 1, wherein the one or more integrated circuit devices are configured to:
   based on identifying the flow of communication traffic to which the OAM data unit belongs, generate an indicator of the flow of communication traffic to which the OAM data unit belongs.

8. The apparatus of claim 7, wherein the one or more integrated circuit devices are configured to:
   retrieve the first entry from the OAM action data using the generated indicator.

9. The apparatus of claim 8, wherein:
   the memory stores a second table having the plurality of entries that indicate how OAM data units in a plurality of respective flows of communication traffic received by the network device are to be processed by the network device; and
   the one or more integrated circuit devices are configured to use the indicator of the flow as an index to the second table to retrieve the first entry from the second table.

10. The apparatus of claim 8, wherein multiple entries among the plurality of entries include respective flags to indicate whether the network device should process data units in respective flows based on respective operation codes (opcodes) of the data units.

11. The apparatus of claim 10, wherein the multiple entries among the plurality of entries includes at least one of:
(i) respective first flags to indicate whether the one or more integrated circuit devices should increment respective loss measurement (LM) counters in response to receiving data units in respective flows, and/or
(ii) respective second flags to indicate whether the one or more integrated circuit devices should use data units in respective flows in keep-alive aging.

12. The apparatus of claim 10, wherein:
entries among the multiple entries include respective Maintenance Entity Group (MEG) threshold levels, wherein the first entry includes a first MEG threshold level, and
the one or more integrated circuit devices are configured to (i) drop the OAM data unit in response to a MEG level of the data unit not meeting the first MEG threshold level in the first entry, and (ii) further process the OAM data unit in accordance with the first entry in response to the MEG level of the OAM data unit meeting the first MEG threshold level in the first entry.

13. The apparatus of claim 1, wherein:
the OAM action data including the plurality of entries is arranged in a second table stored in the memory.

14. A method for processing an Operations, Administration, and Maintenance (OAM) data unit in a network device, the method comprising:
receiving, via the network device, network traffic that includes the OAM data unit;
identifying, with the network device, a first data flow to which the OAM data unit belongs from among a plurality of data flows of network traffic received by the network device;
based on identifying the flow of communication traffic to which the OAM data unit belongs, retrieving, from a memory of the network device, a first entry corresponding to the flow, wherein
the memory stores OAM action data including a plurality of entries that indicate how OAM data units in a plurality of respective flows of communication traffic received by the network device are to be processed by the network device, wherein multiple entries among the plurality of entries include respective indices to at least one table stored in the memory,
the first entry is from among the plurality of entries,
the first entry indicates how OAM data units in the flow are to be processed by the network device including whether the network device should modify the OAM data unit as part of an OAM action, and
the first entry includes an index to a first table among the at least one table;
when the first entry indicates that the network device should modify the OAM data unit as part of the OAM action, obtain a second entry from the first table using the index included in the first entry, the second entry from the first table indicating how OAM data units in the flow are to be modified; and
processing the OAM data unit in accordance with the first entry, including: when the first entry indicates that the network device should modify the OAM data unit as part of the OAM action, modifying the OAM data unit in accordance with the second entry from the first table.

15. The method of claim 14, wherein:
the first entry indicates whether time stamping is enabled for the flow;
the method further comprises, if the first entry indicates that time stamping is enabled for the flow,
determining, with the network device, whether a time stamp is to be added to the data unit,
determining a location in the data unit at which to add the time stamp using the second entry in the first table if it is determined that the time stamp is to be added to the data unit, and
adding, with the network device, the time stamp at the determined location to the data unit if it is determined that the time stamp is to be added to the data unit; and
the method further comprises, if the first entry indicates that time stamping is not enabled for the flow,
not adding the time stamp to the data unit.

16. The method of claim 14, wherein:
the first entry indicates whether an opcode included in the packet should be examined to determine whether the time stamp is to be added to the data unit;
the method further comprises, if the first entry indicates that the opcode included in the packet should be examined to determine whether the time stamp is to be added to the data unit,
examining, with the network device, the opcode to determine whether the time stamp is to be added to the data unit, and
adding, with the network device, the time stamp to the data unit if the opcode indicates that the time stamp is to be added to the data unit; and
the method further comprises, if the first entry does not indicate that the opcode included in the packet is to be examined to determine whether the time stamp is to be added to the data unit,
adding, with the network device, the time stamp to the data unit.

17. The method of claim 14, wherein:
the first table is an offset table;
multiple entries among a plurality of entries in the offset table indicate respective locations within data units at which timestamps are to be inserted; and
the method further comprises, when the first entry indicates that time stamping is enabled for the flow and when it is determined that the time stamp is to be added to the data unit,
determining, with the network device, a location for the time stamp using the second entry retrieved from the offset table, and
adding, with the network device, the time stamp to the data unit at the determined location.

18. The method of claim 14, wherein:
the first entry indicates whether a value of a loss measurement (LM) counter should be added to data units in the flow; and
the method further comprises:
adding, with the network device, the value of the LM counter to the data unit if the first entry indicates that the value of the LM counter should be added to data units in the flow, and
not adding the value of the LM counter to the data unit if the first entry indicates that the value of the LM counter should not be added to data units in the flow.

19. The method of claim 14, wherein identifying the first data flow to which the OAM data unit belongs comprises utilizing one of a content-addressable memory (CAM) unit or a ternary CAM (TCAM) unit to identify the flow to which the OAM data unit belongs from among the plurality of flows.

20. The method of claim 14, further comprising:
based on identifying the flow of communication traffic to which the OAM data unit belongs, generating, with the network device, an indicator of the flow of communication traffic to which the OAM data unit belongs.

21. The method of claim 20, further comprising:
retrieving, with the network device, the first entry from the OAM action data using the generated indicator.

22. The method of claim 21, wherein:
the memory stores a second table having the plurality of entries that indicate how OAM data units in a plurality of respective flows of communication traffic received by the network device are to be processed by the network device; and
the method comprises use the indicator of the flow as an index to the second table to retrieve the first entry from the second table.

23. The method of claim 14, wherein:
entries among the multiple entries include respective Maintenance Entity Group (MEG) threshold levels, and
the method comprises:
dropping, with the network device, the OAM data unit in response to a MEG level of the data unit not meeting a corresponding MEG threshold level in a corresponding entry, and
further processing, with the network device, the OAM data unit in accordance with the first entry in response to the MEG level of the OAM data unit meeting the first MEG threshold level in the first entry.

24. The method of claim 14, wherein:
the OAM action data including the plurality of entries is arranged in a second table stored in the memory; and
retrieving the first entry corresponding to the flow comprises retrieving the first entry from the second table.

* * * * *